US010893627B2

(12) United States Patent
Fournier

(10) Patent No.: US 10,893,627 B2
(45) Date of Patent: Jan. 12, 2021

(54) ELECTRONIC CABINET, AND AIR INLET THEREFORE

(71) Applicant: LOGISIG INC., Québec (CA)

(72) Inventor: Serge Fournier, Lac-Beauport (CA)

(73) Assignee: LOGISIG INC., Quebec (CA)

(*) Notice: Subject to any disclaimer, the term of this patent is extended or adjusted under 35 U.S.C. 154(b) by 229 days.

(21) Appl. No.: 15/461,692

(22) Filed: Mar. 17, 2017

(65) Prior Publication Data
US 2017/0273213 A1 Sep. 21, 2017

(30) Foreign Application Priority Data

Mar. 18, 2016 (CA) ..................................... 2924437

(51) Int. Cl.
*H05K 7/20* (2006.01)
*B01D 46/00* (2006.01)
*H05K 5/02* (2006.01)

(52) U.S. Cl.
CPC ..... *H05K 7/20009* (2013.01); *B01D 46/0005* (2013.01); *H05K 5/0213* (2013.01); *H05K 5/0217* (2013.01); *B01D 2279/35* (2013.01)

(58) Field of Classification Search
CPC ....... G06F 1/181–182; H05K 7/20218–20381; H05K 7/20409–20418; H05K 7/20009–202; H05K 5/0213; H05K 5/0217; H05K 7/20545; H01L 23/367–3677; H01L 23/473; H01L 23/46–467; B01D 46/0005; B01D 2279/35

USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236

See application file for complete search history.

(56) References Cited

U.S. PATENT DOCUMENTS

| 5,510,601 | A | * | 4/1996 | Smith | A21B 1/245 |
| | | | | | 219/400 |
| 5,673,172 | A | * | 9/1997 | Hastings | G06F 1/182 |
| | | | | | 361/679.34 |
| 5,688,398 | A | * | 11/1997 | Jacquelin | H01F 27/14 |
| | | | | | 165/104.33 |
| 5,697,840 | A | * | 12/1997 | Bainbridge | H05K 7/20172 |
| | | | | | 361/645 |
| 6,100,468 | A | * | 8/2000 | Niggl | H05K 7/20572 |
| | | | | | 174/535 |
| 6,198,627 | B1 | * | 3/2001 | Roehling | G06F 1/181 |
| | | | | | 361/679.33 |

(Continued)

*Primary Examiner* — Stephen S Sul
(74) *Attorney, Agent, or Firm* — Norton Rose Fulbright Canada LLP; Alexandre Daoust

(57) ABSTRACT

The electronic cabinet for enclosing electronic components generally has a housing having a base and a cover being connected to one another a plurality of lateral walls, one of the plurality of lateral walls having a first opening; a lateral perforated plate being mounted to the housing and extending over the first opening, the lateral perforated plate having a plurality of perforations; and a protector plate being mounted to the housing and extending over the lateral perforated plate to cover the plurality of perforations of the lateral perforated plate, the protector plate defining at least one air inlet between the protector plate and the lateral perforated plate.

17 Claims, 17 Drawing Sheets

(56) References Cited

U.S. PATENT DOCUMENTS

| | | | |
|---|---|---|---|
| 6,264,551 B1* | 7/2001 | Smith | F24F 13/068 454/245 |
| 6,932,443 B1* | 8/2005 | Kaplan | H05K 7/20545 312/213 |
| 7,161,801 B2* | 1/2007 | Chen | G06F 1/20 181/198 |
| 8,033,837 B2* | 10/2011 | Yang | H01R 12/724 439/607.4 |
| 8,312,873 B2* | 11/2012 | Gagas | F24C 15/2035 126/299 D |
| 9,297,582 B2* | 3/2016 | Crawford | F26B 3/02 |
| 2002/0121474 A1* | 9/2002 | Cullen | B01D 29/21 210/493.1 |
| 2004/0114326 A1* | 6/2004 | Dodgen | H05K 7/206 361/694 |
| 2005/0168964 A1* | 8/2005 | Plabst | H05K 9/0062 361/816 |
| 2005/0231915 A1* | 10/2005 | Keenan | H05K 7/20572 361/700 |
| 2008/0151497 A1* | 6/2008 | Lai | H05K 7/20736 361/695 |
| 2008/0179072 A1* | 7/2008 | Drane | H01H 21/085 174/67 |
| 2009/0021910 A1* | 1/2009 | Lai | H05K 7/20181 361/695 |
| 2009/0143003 A1* | 6/2009 | Roesch | H05K 5/0213 454/256 |
| 2009/0185348 A1* | 7/2009 | Bretschneider | H05K 7/20181 361/695 |
| 2009/0190301 A1* | 7/2009 | Huang | H05K 7/20736 361/679.46 |
| 2011/0007474 A1* | 1/2011 | Detore | G01N 33/92 361/679.48 |
| 2011/0192580 A1* | 8/2011 | Tsuji | H05K 7/206 165/121 |
| 2011/0222241 A1* | 9/2011 | Shearman | H05K 7/20572 361/692 |
| 2011/0234065 A1* | 9/2011 | Chang | G06F 1/182 312/237 |
| 2011/0317357 A1* | 12/2011 | Sato | H05K 7/20754 361/679.48 |
| 2012/0008275 A1* | 1/2012 | Doll | G06F 1/20 361/679.47 |
| 2012/0298330 A1* | 11/2012 | Mysse, III | H05K 5/0213 165/96 |
| 2012/0329378 A1* | 12/2012 | Lucia | H05K 7/20745 454/184 |
| 2014/0148087 A1* | 5/2014 | Hoglund | H05K 7/20572 454/184 |
| 2014/0301036 A1* | 10/2014 | Chainer | H05K 7/2079 361/679.47 |
| 2015/0049452 A1* | 2/2015 | Franck | H05K 7/14 361/809 |
| 2015/0077935 A1* | 3/2015 | Wright | H05K 7/20181 361/695 |
| 2015/0097471 A1* | 4/2015 | Bailey | H05K 5/061 312/100 |
| 2015/0237768 A1* | 8/2015 | Endo | H05K 7/20736 361/679.49 |
| 2015/0296664 A1* | 10/2015 | Peng | H05K 7/20727 361/679.46 |
| 2015/0351288 A1* | 12/2015 | Fukuda | B01D 46/0065 361/679.48 |
| 2016/0037687 A1* | 2/2016 | Stevens | G11B 33/142 361/679.31 |
| 2016/0044827 A1* | 2/2016 | Proctor | H05K 7/20127 361/692 |

* cited by examiner

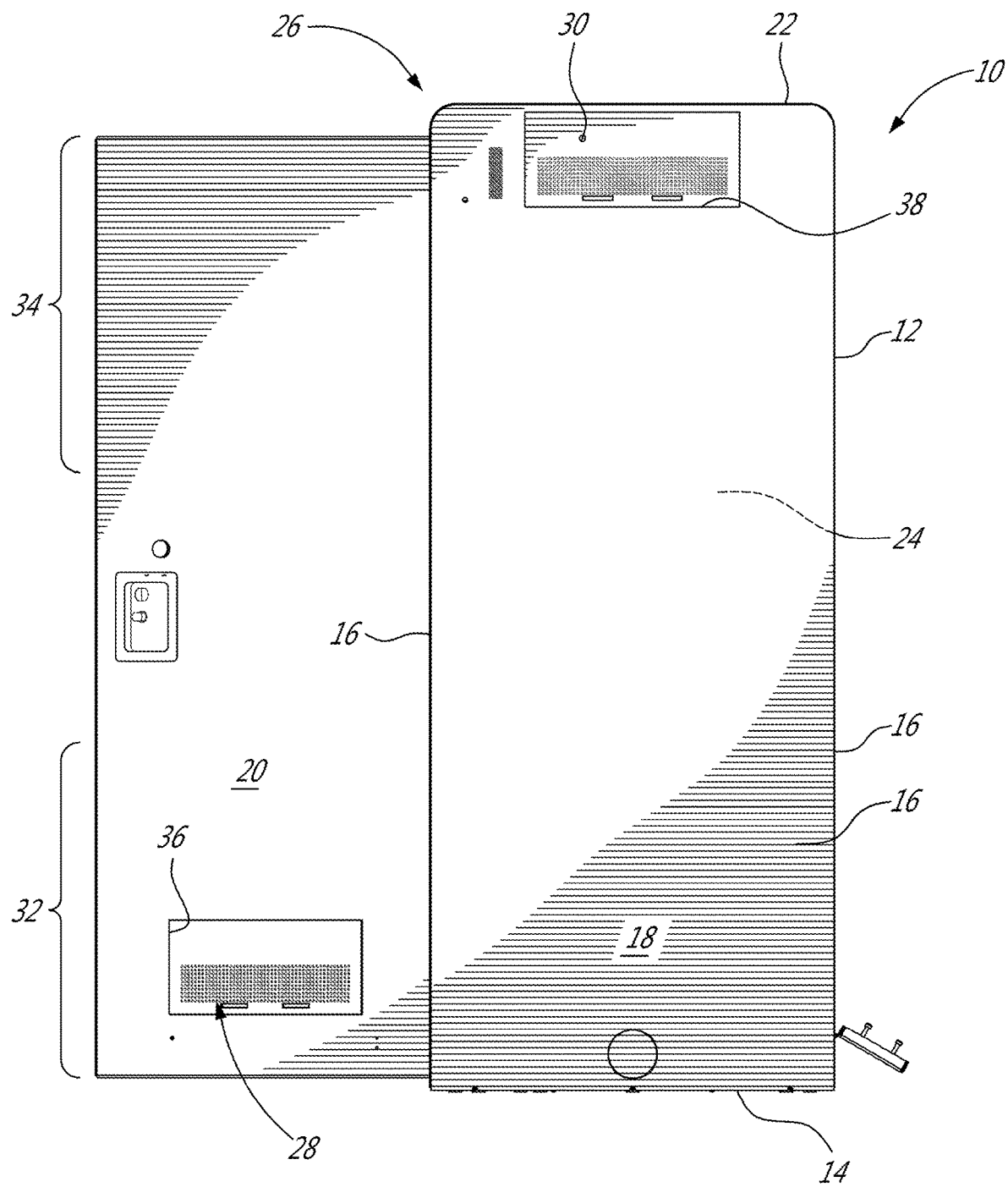
FIG_1

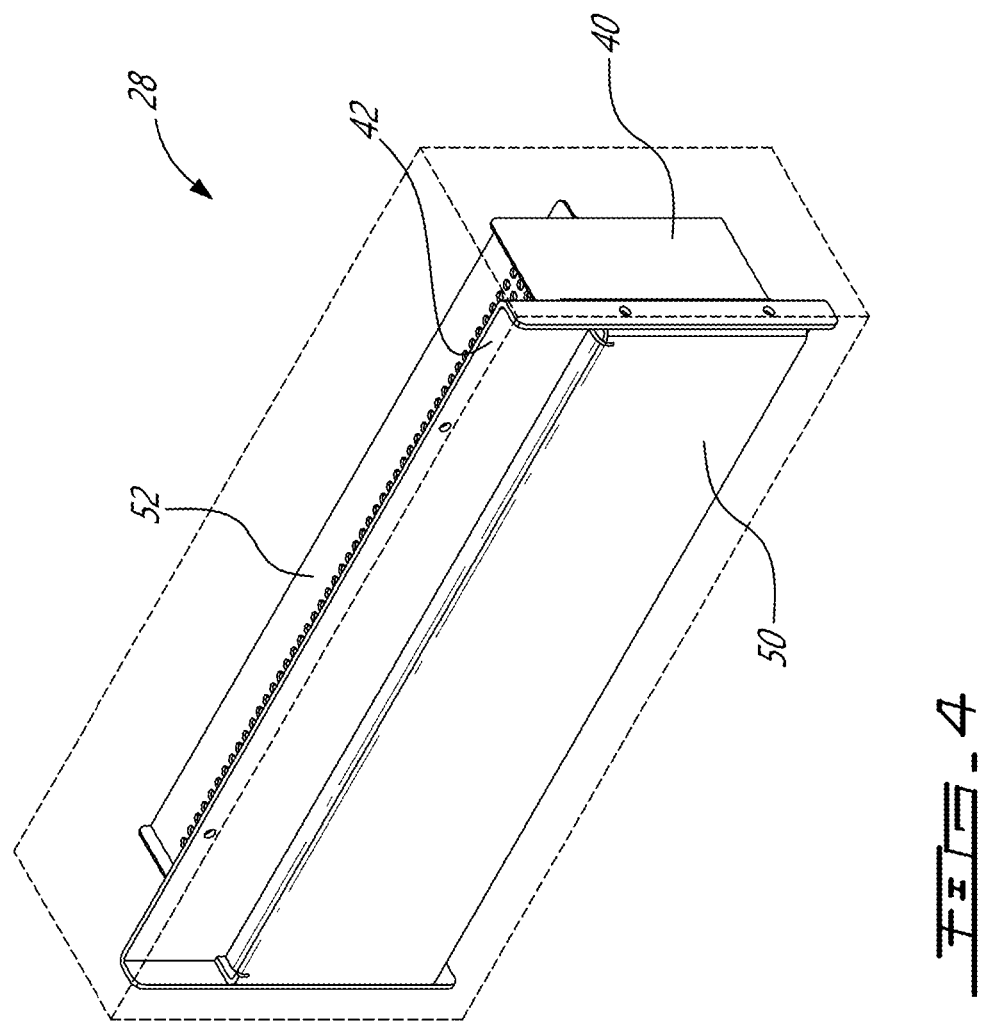

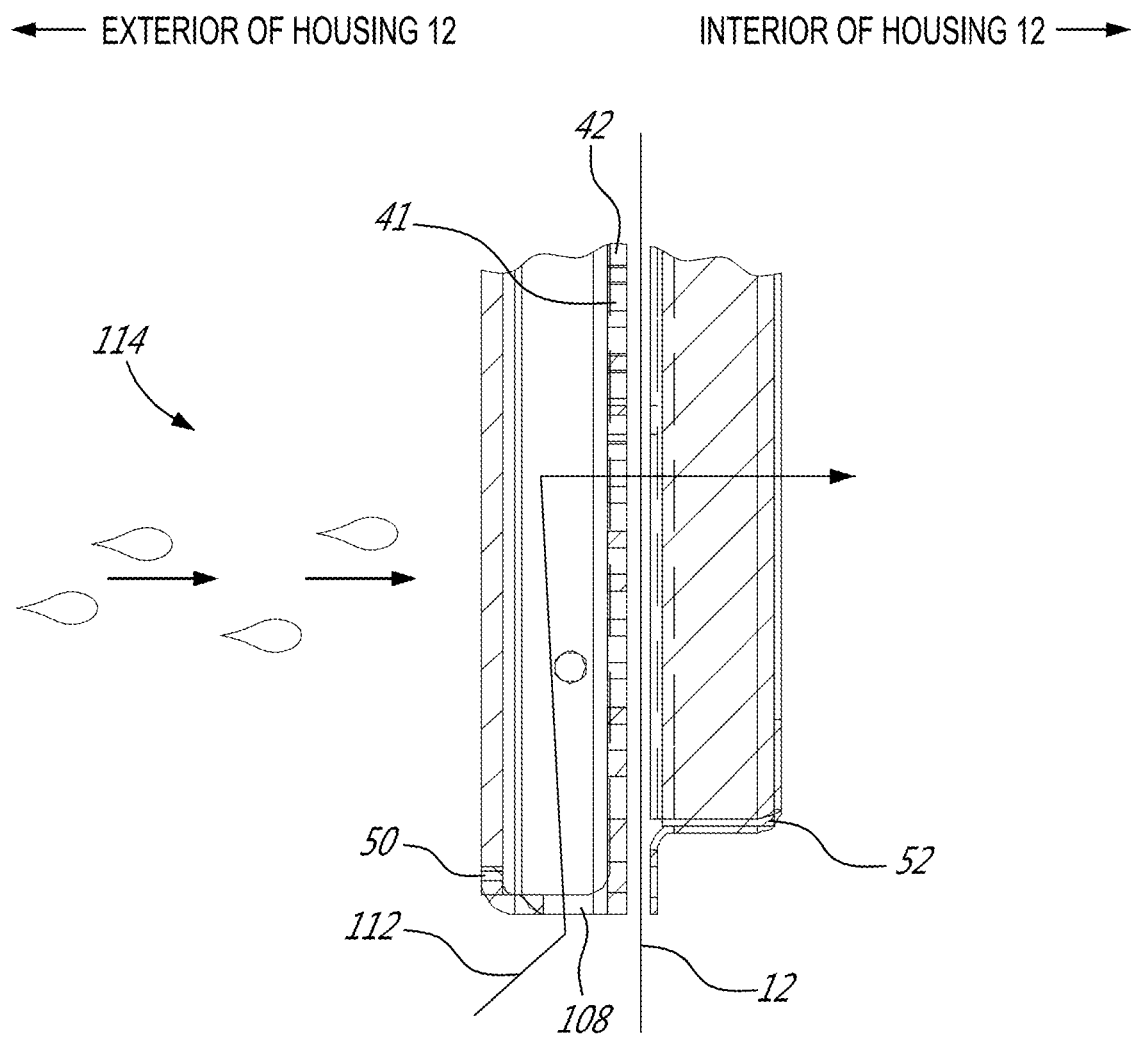
FIG_7

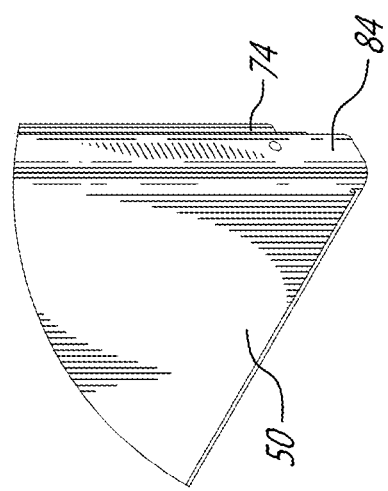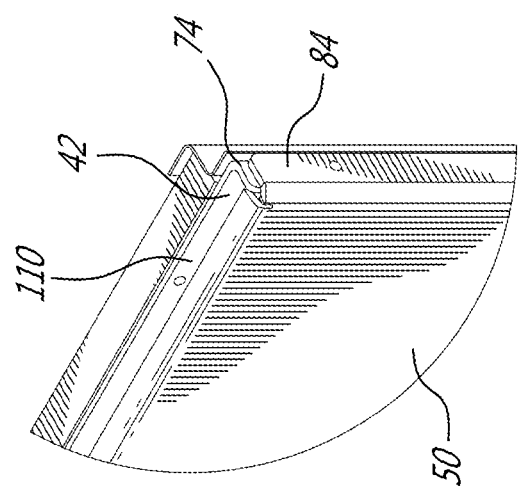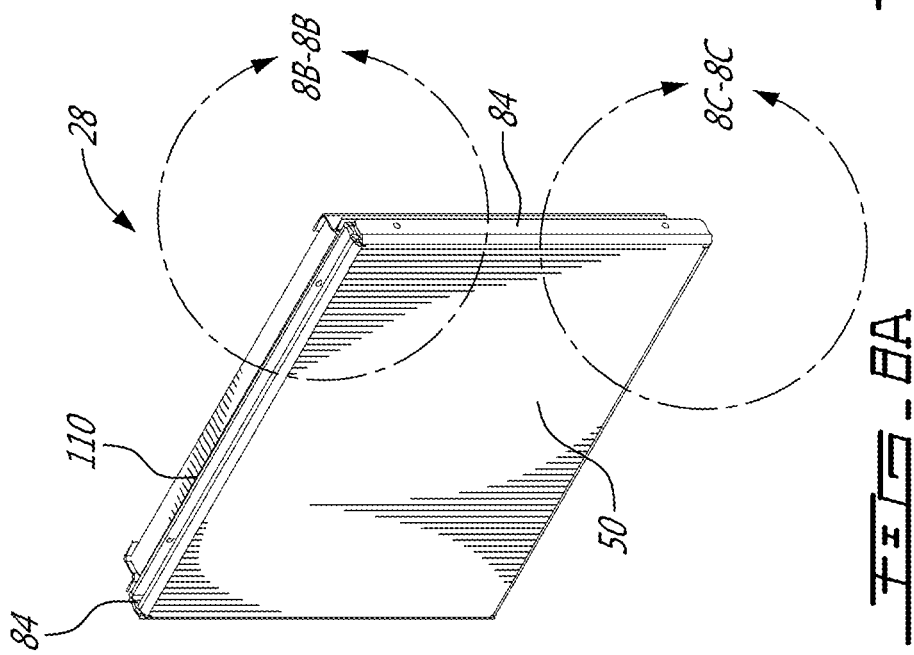

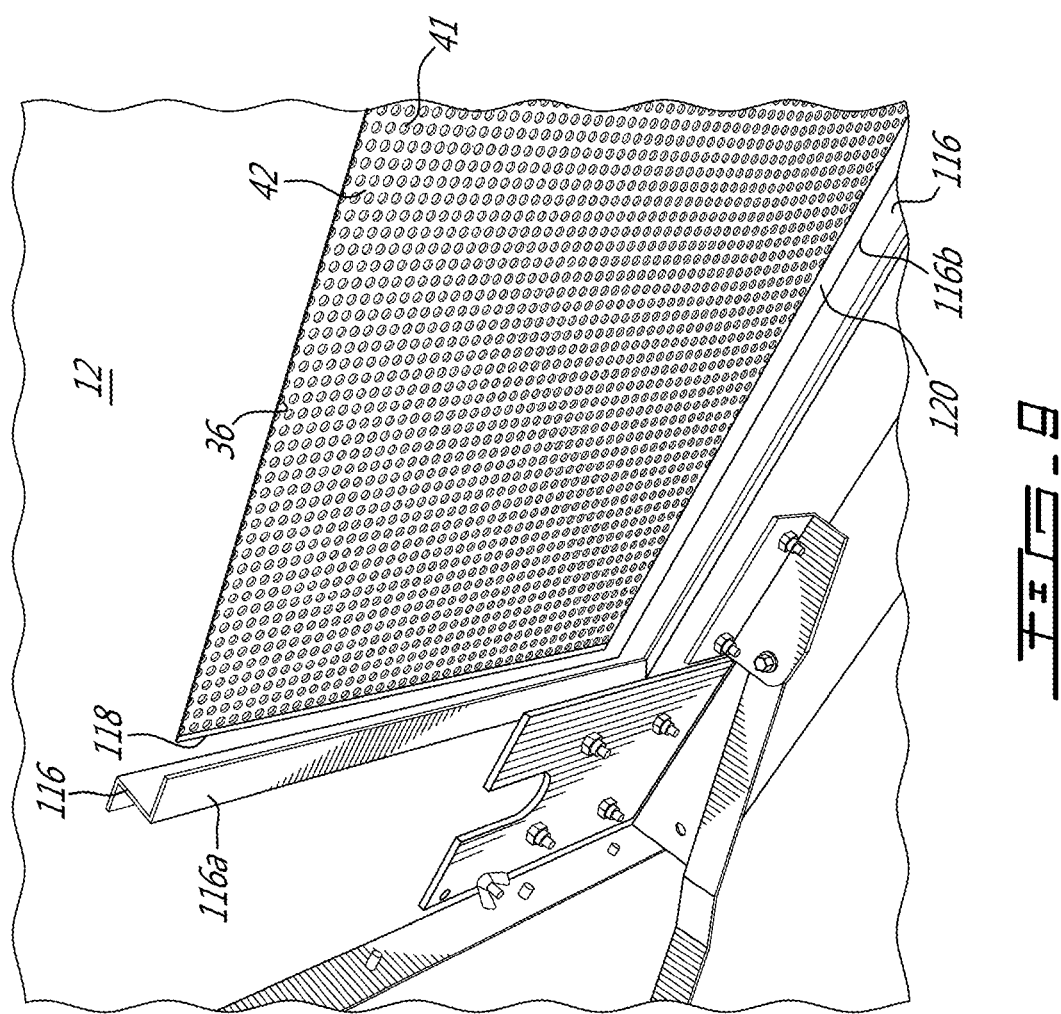

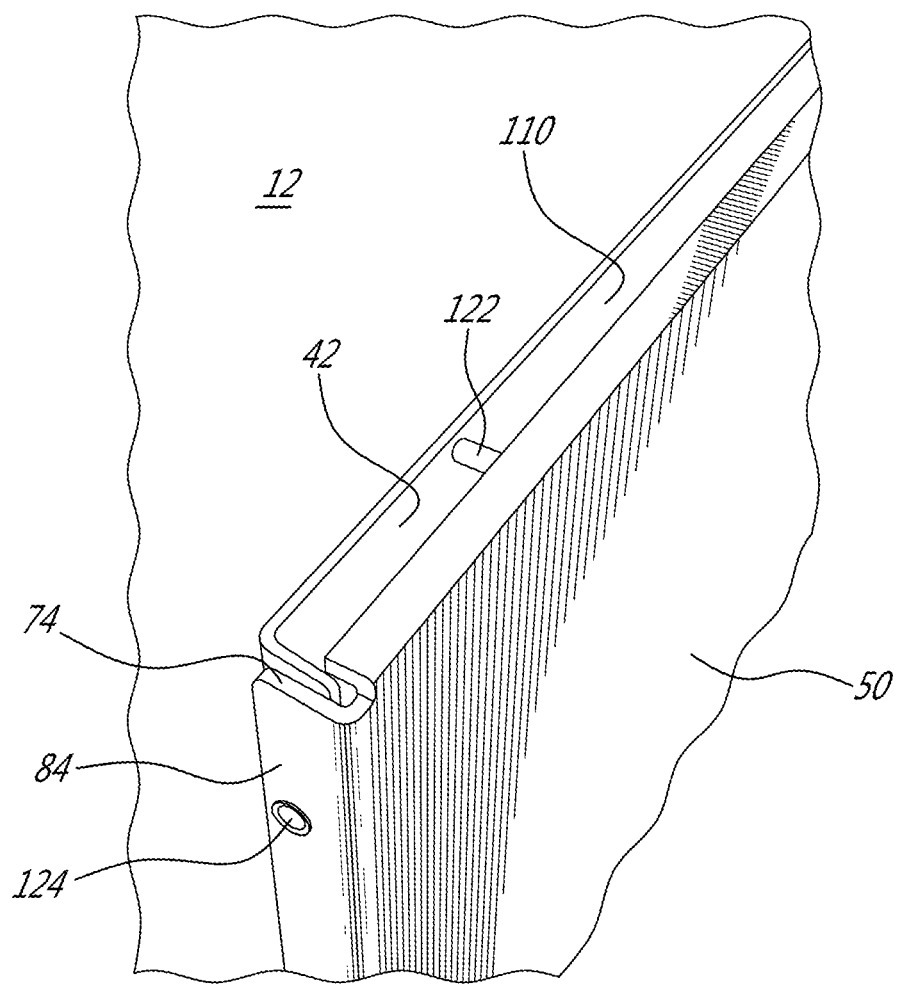
FIG_10

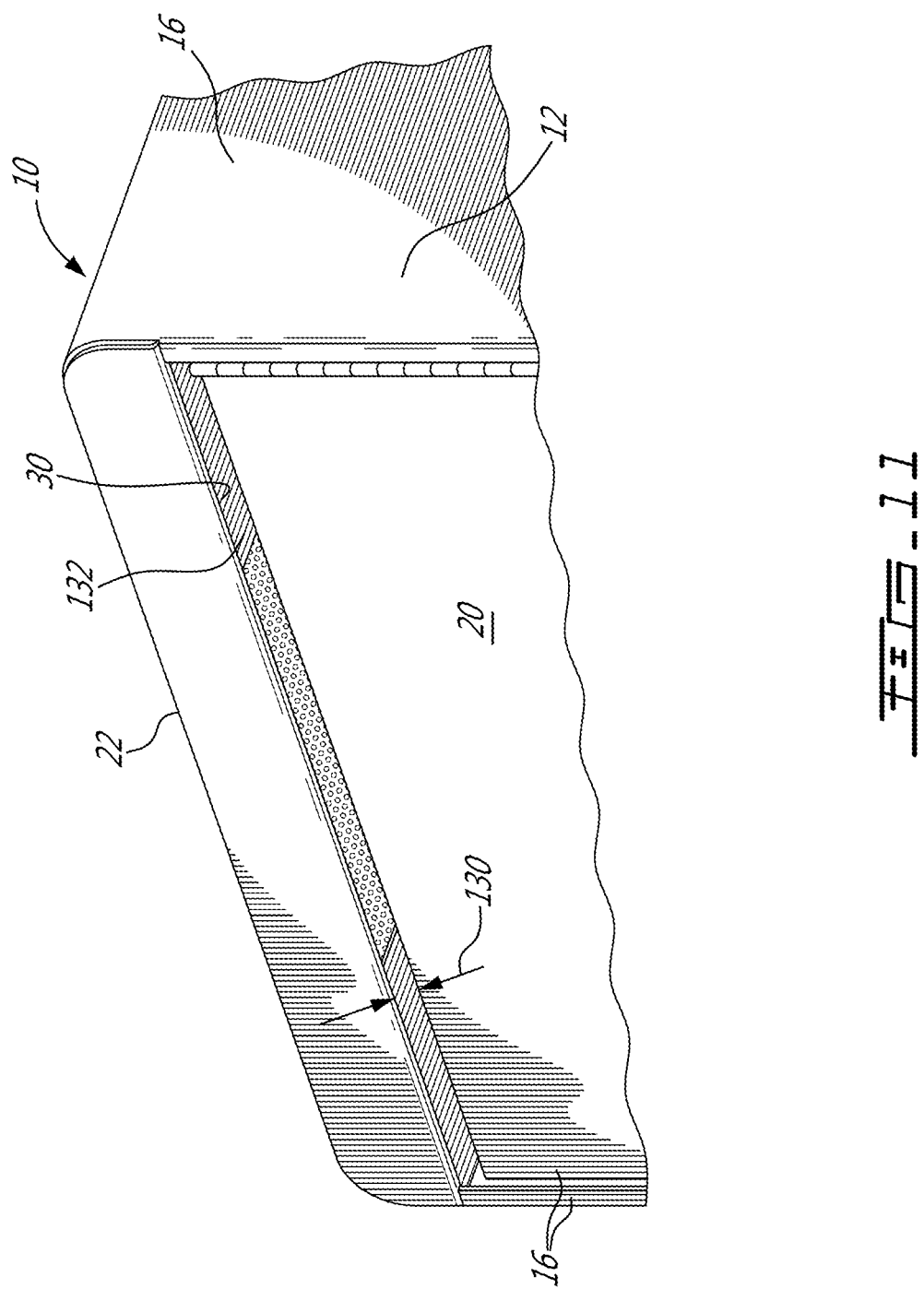

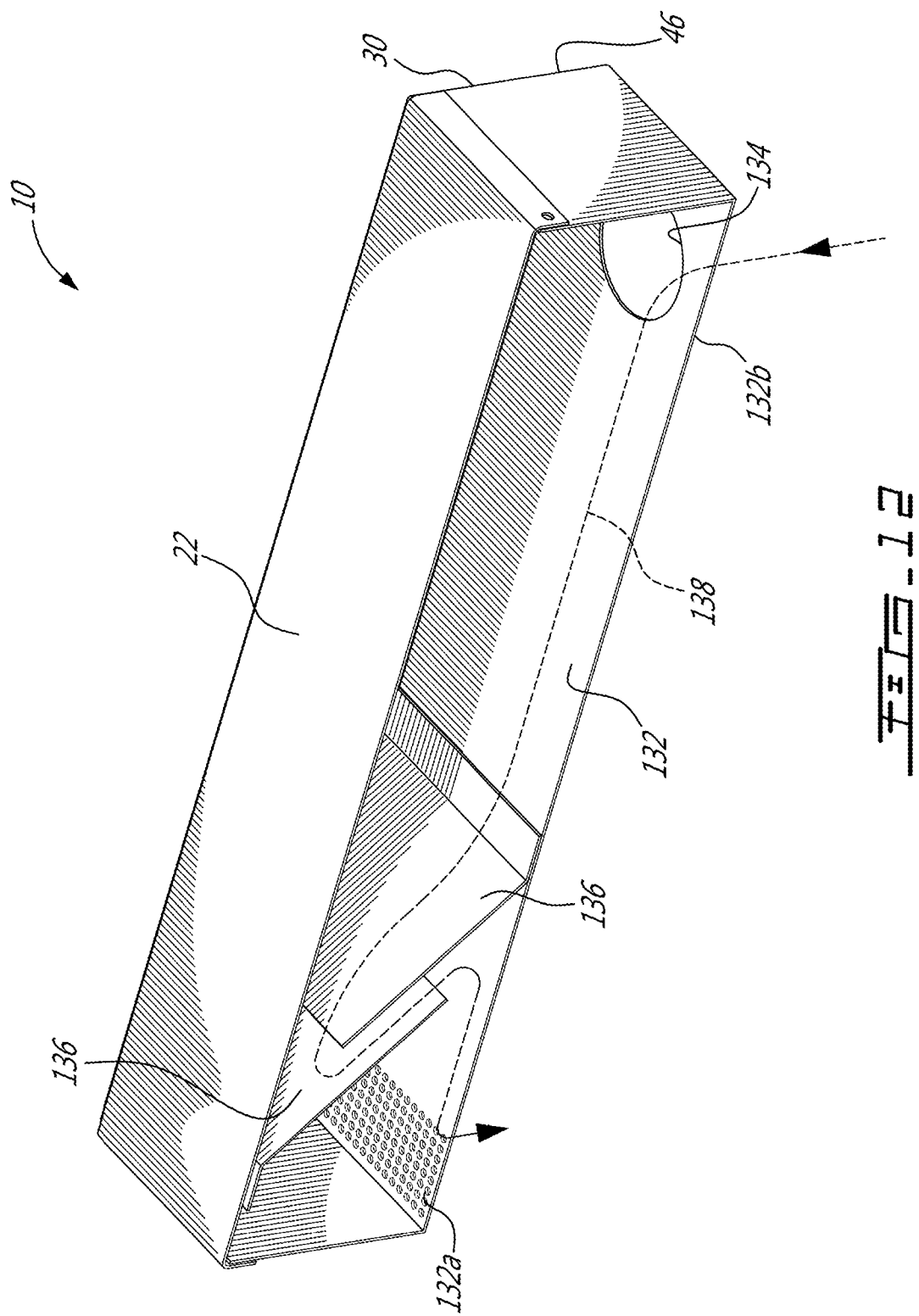

US 10,893,627 B2

ELECTRONIC CABINET, AND AIR INLET THEREFORE

FIELD

The improvements generally relate to the field of electronic cabinets and more particularly electronic cabinets having ventilation systems.

BACKGROUND

A typical outdoor electronic cabinet generally has a weather-resistant housing enclosing therein electronic components. During use, the electronic components can generate heat inside the housing of the electronic cabinet. For at least this reason, the typical electronic cabinet can be arranged with a ventilation system. In cases where the ventilation system involves natural convection, the ventilation system typically includes a first opening at a top of the housing and a second opening at a bottom of the housing. When the electronic components heat the air inside the housing, a natural convection flow from the bottom to the top of the housing evacuates the heated air outside the housing via the first opening while the evacuated air is replaced by unheated air via the second opening of the ventilation system and thus cools the inside of the housing.

To prevent natural precipitations of water and snow to enter inside the housing via the ventilation system, the first and/or second openings are generally provided with louvers. Although the existing electronic cabinets were satisfactory to a certain degree, there remains room for improvement, particularly when the electronic cabinet is used outdoors.

SUMMARY

It was found that although such louvers were satisfactory to prevent natural precipitations of water and snow to enter inside the housing of the cabinet, such louvers were generally unsatisfactory to prevent unnatural precipitations from entering inside the housing. For instance, when an electronic cabinet is located near a road, passage of vehicles (cars, trucks and snow plow trucks) on the road can cause unnatural precipitations such as accidental and violent projections of water, snow, slush and/or particles towards the electronic cabinet. One need thus occurred for protecting the electronic cabinet from such unnatural precipitations while still allowing it to be satisfactorily ventilated. There is thus provided an electronic cabinet which can be weather resistant.

In accordance with one aspect, there is provided an electronic cabinet for enclosing electronic components, the electronic cabinet comprising: a housing having a base and a cover being connected to one another a plurality of lateral walls, one of the plurality of lateral walls having a first opening; a lateral perforated plate being mounted to the housing and extending over the first opening, the lateral perforated plate having a plurality of perforations; and a protector plate being mounted to the housing and extending over the lateral perforated plate to cover the plurality of perforations of the lateral perforated plate, the protector plate defining at least one air inlet between the protector plate and the lateral perforated plate.

In accordance with another aspect, there is provided an air inlet module for an electronic cabinet having an air inlet module opening, the air inlet module comprising: a lateral perforated plate being mountable to the housing at the air inlet module opening and being sized and shaped to cover the air inlet module opening, the lateral perforated plate having a plurality of perforations; and a protector plate being outwardly mountable to the housing and being sized and shaped to extend over the lateral perforated plate to cover the plurality of perforations of the lateral perforated plate, the protector plate defining at least one air inlet between the protector plate and the lateral perforated plate when the protector plate and the lateral perforated plate are mounted to the housing of the electronic cabinet.

Many further features and combinations thereof concerning the present improvements will appear to those skilled in the art following a reading of the instant disclosure.

DESCRIPTION OF THE FIGURES

In the figures,

FIG. 1 is a rear elevation view of an example of an electronic cabinet including a ventilation system having an air inlet module and an air outlet module;

FIG. 4 is an oblique view of an example of an air inlet module having a protector plate and a filter element;

FIG. 7 is an enlarged view of a side elevation view of the air inlet module of FIGS. 6A to 6E;

FIGS. 8A to 8C are oblique views of the air inlet module of FIGS. 6A to 6E;

FIG. 9 is an oblique view of the air inlet module of FIGS. 6A to 6E mounted to a housing of an electronic cabinet taken from the interior of the electronic cabinet;

FIG. 10 is an oblique view of the air inlet module of FIGS. 6A to 6E mounted to a housing of an electronic cabinet taken from the exterior of the electronic cabinet;

FIG. 11 is an oblique view, taken from the bottom, of an example of an electronic cabinet having an air outlet module in accordance with another embodiment;

FIG. 12 is a sectional and oblique view, taken from above, of the electronic cabinet of FIG. 11.

DETAILED DESCRIPTION

Figure 2A:
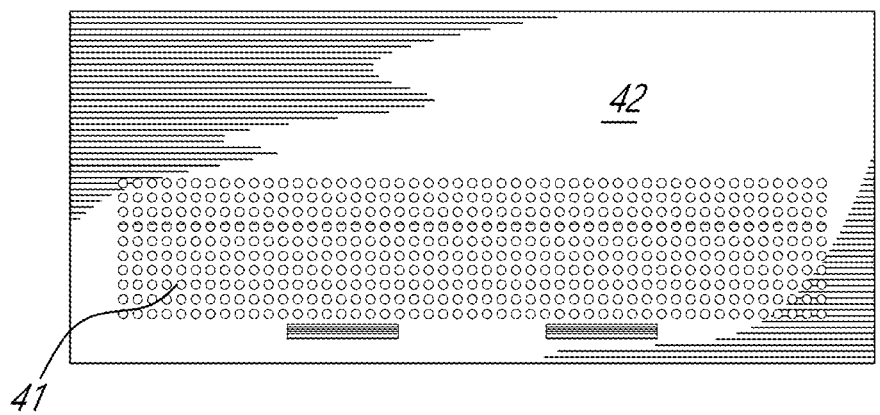
FIGS. 2A to 2F represent different views of the air inlet module of FIG. 1.
Figure 2B:
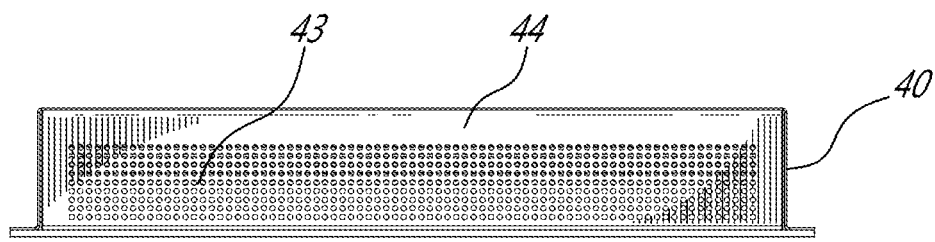
Figure 2C:
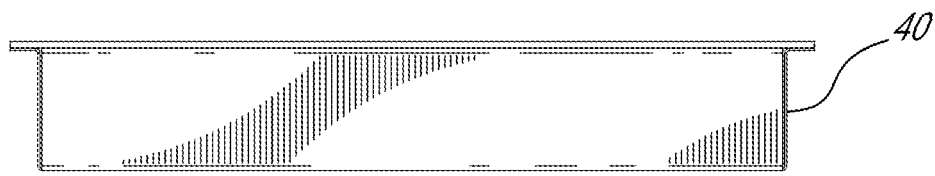
Figure 2D:
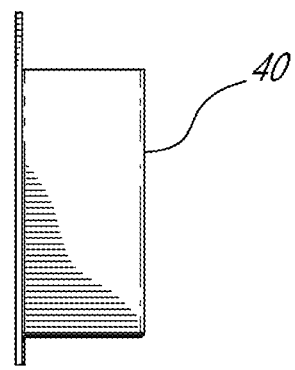
Figure 2E:
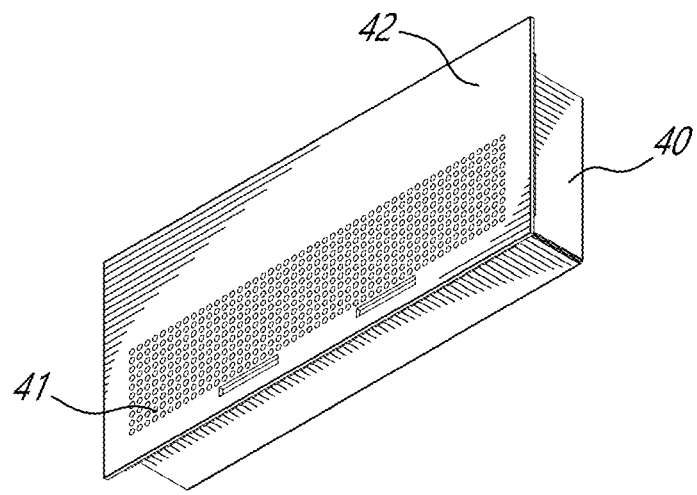
Figure 2F:
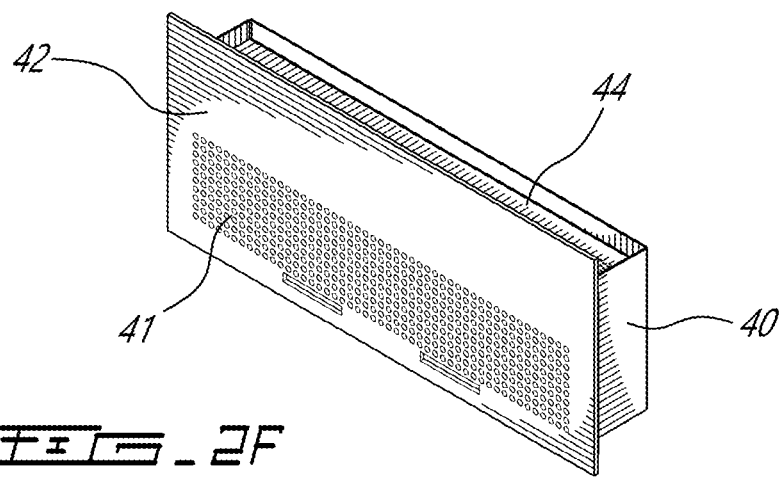
Figure 3A:
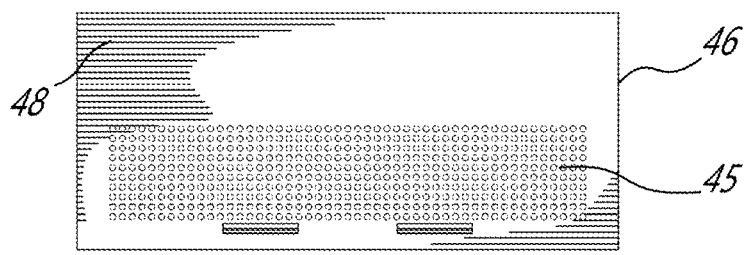
FIGS. 3A to 3F represent different views of the air outlet module of FIG. 1.
Figure 3B:
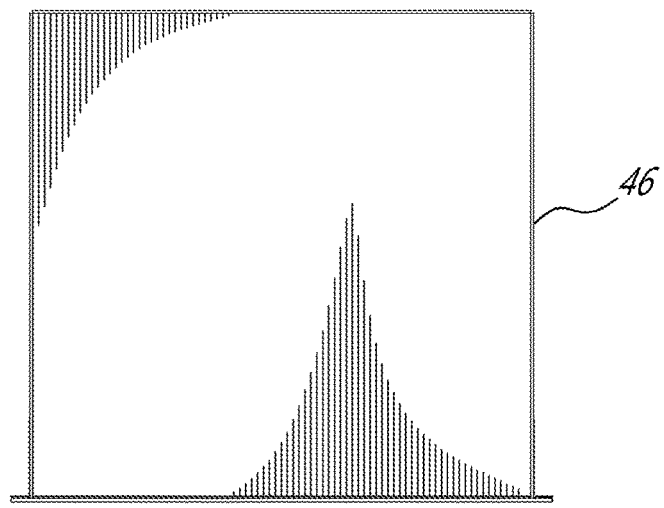
Figure 3C:
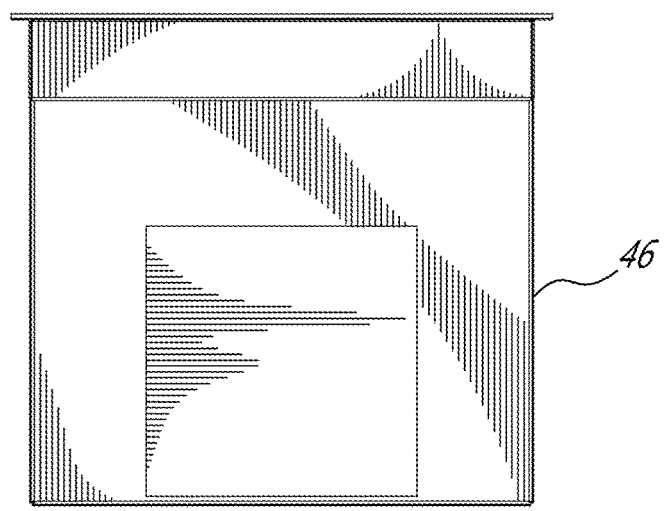
Figure 3D:
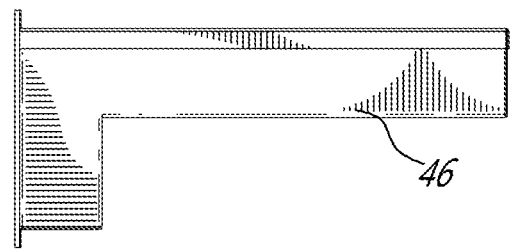
Figure 3E:
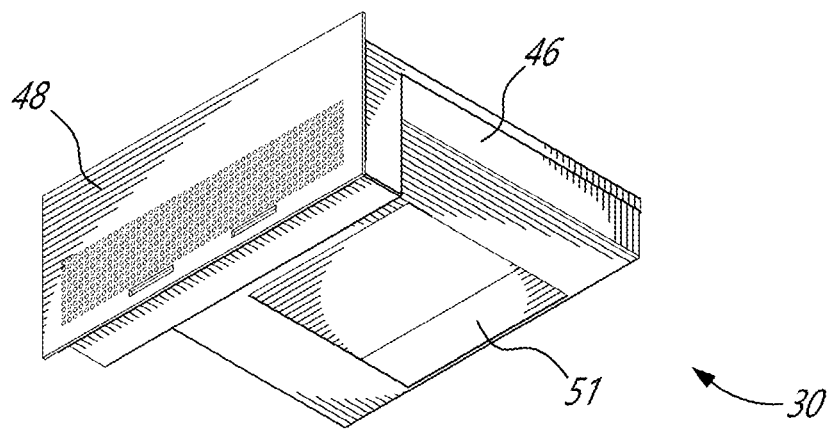
Figure 3F:
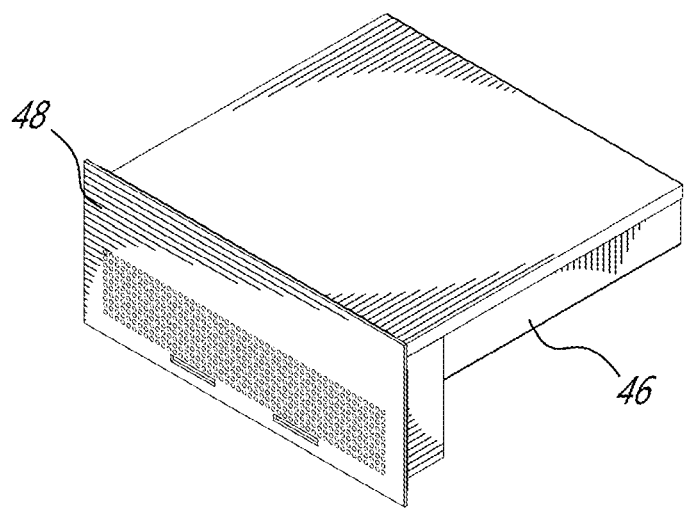

FIG. 1 shows an example of an electronic cabinet 10, in accordance with an embodiment. The electronic cabinet 10 has a housing 12 generally having a base 14, lateral walls 16 (including a back wall 18 and a front door 20 with a door handle) connected to the base 14 and a cover 22 connected to the lateral walls 16.

As depicted, the housing 12 encloses electronic components 24 inside the housing 12. The electronic components 24 can convert electrical energy into thermal energy which generally heats the air inside the housing 12 during use. To evacuate the heated air outside the housing 12, and thus prevent failures of some of the electronic components 24, the electronic cabinet 10 has a ventilation system 26 having an air inlet module 28 and an air outlet module 30.

To take advantage of natural convection, the air inlet module 28 is generally provided in a bottom portion 32 of the housing 12 whereas the air outlet module 30 is generally provided in a top portion 34 of the housing 12. Therefore, the heated air, which tends to go up due to its lower density (compared with unheated air), is evacuated via the air outlet module 30 provided at the top portion 34 while unheated/cooler air can enter inside the housing 12 via the air inlet module 28 provided at the bottom 32 of the housing 12 and thus cools the interior of the housing 12. As it will be understood by the skilled reader, the air inlet and outlet modules 28 and 30 are not limited to the bottom and top portions 32 and 34 shown in FIG. 1. Any other suitably location can be used.

In this embodiment, the air inlet and outlet modules 28 and 30 are removably mounted to the housing 12 in order to be replaced when worn and/or broken, for instance. More specifically, in this example, the door 20 (or any lateral wall) has an air inlet module opening 36 which receives the air inlet module 28 and the back wall 18 (or any lateral wall) has an air outlet module opening 38 which receives the air outlet module 30. In this example, the air inlet and outlet modules 28 and 30 are mounted to the housing 12 via fasteners (bolt and nuts, screws, weld lines, adhesive, etc). These fasteners are provided inside the housing 12 to be inaccessible from the exterior of the housing 12.

FIGS. 2A to 2F show different views of the air inlet module 28. These views include a front elevation view A, a top elevation view B, a bottom elevation view C, a side elevation view D, an oblique view taken from below E and an oblique view taken from above F. As it can be seen, the air inlet module 28 has a frame 40 which can be received in the air inlet module opening 36 of the housing 12 of the electronic cabinet 10 (see FIG. 1). The frame 40 has a lateral plate which is perforated with a plurality of perforations 41 (referred to as the "lateral perforated plate 42") and a top plate which is perforated with a plurality of perforations 43 (referred to as the "top perforated plate 44"). The lateral perforated plate is sized and shaped to cover the air inlet module opening and extend over the air inlet module opening from the interior or from the exterior.

The perforations 41, 43 are sized and shaped to prevent objects or animals to enter inside the housing of the electronic cabinet while still allowing air to enter therein. It is noted that once the air has entered via the lateral perforated plate 42, it can access the interior of the housing of the electronic cabinet via the top perforated plate 44. In this example, the perforations 41,43 of the plates 42,44 are provided in a rectangular array of through holes. Other suitable perforations can be used.

FIGS. 3A to 3F shows different views of air outlet module 30. These views include a front elevation view A, a top elevation view B, a bottom elevation view C, a side elevation view D, an oblique taken from below E and an oblique view taken above F. As it can be seen, the air outlet module 30 has an enclosure 46 which can be received in the air outlet module opening 38 of the housing 12 of the electronic cabinet 10 (see FIG. 1). When received therein, the enclosure 46 has a lateral plate which is perforated with a plurality of perforations 45 (referred to as "the lateral perforated plate 48") and a bottom air inlet 51 which is configured to face towards the interior of the housing of the electronic cabinet when mounted thereto.

There again, the perforations 45 are sized and shaped to prevent objects or small animals from entering inside the housing of the electronic cabinet while still allowing air flow through. Still in this example, the perforations 45 are provided in a rectangular array of through holes.

FIG. 4 shows another example of an air inlet module 28, in accordance with another embodiment. Broadly described, the air inlet module 28 has a frame 40 which is receivable in the air inlet module opening 36 of the housing 12 of the electronic cabinet 10 (see FIG. 1) and mountable thereto via, for instance, bore holes and fasteners. The air inlet module 28 has a lateral perforated plate 42 mounted to the frame 40, a protector plate 50 mounted to lateral perforated plate 42 (or directly mounted to the frame 40) and a filter element 52 mounted to the frame 40. The protector plate 50 is sized and shaped to extend over the lateral perforated plate to cover the plurality of perforations of the lateral perforated plate. The filter element 52 extends over the air inlet module opening 36 to filter air and/or to prevent precipitations from entering inside the housing of the electronic cabinet.

Figure 5:
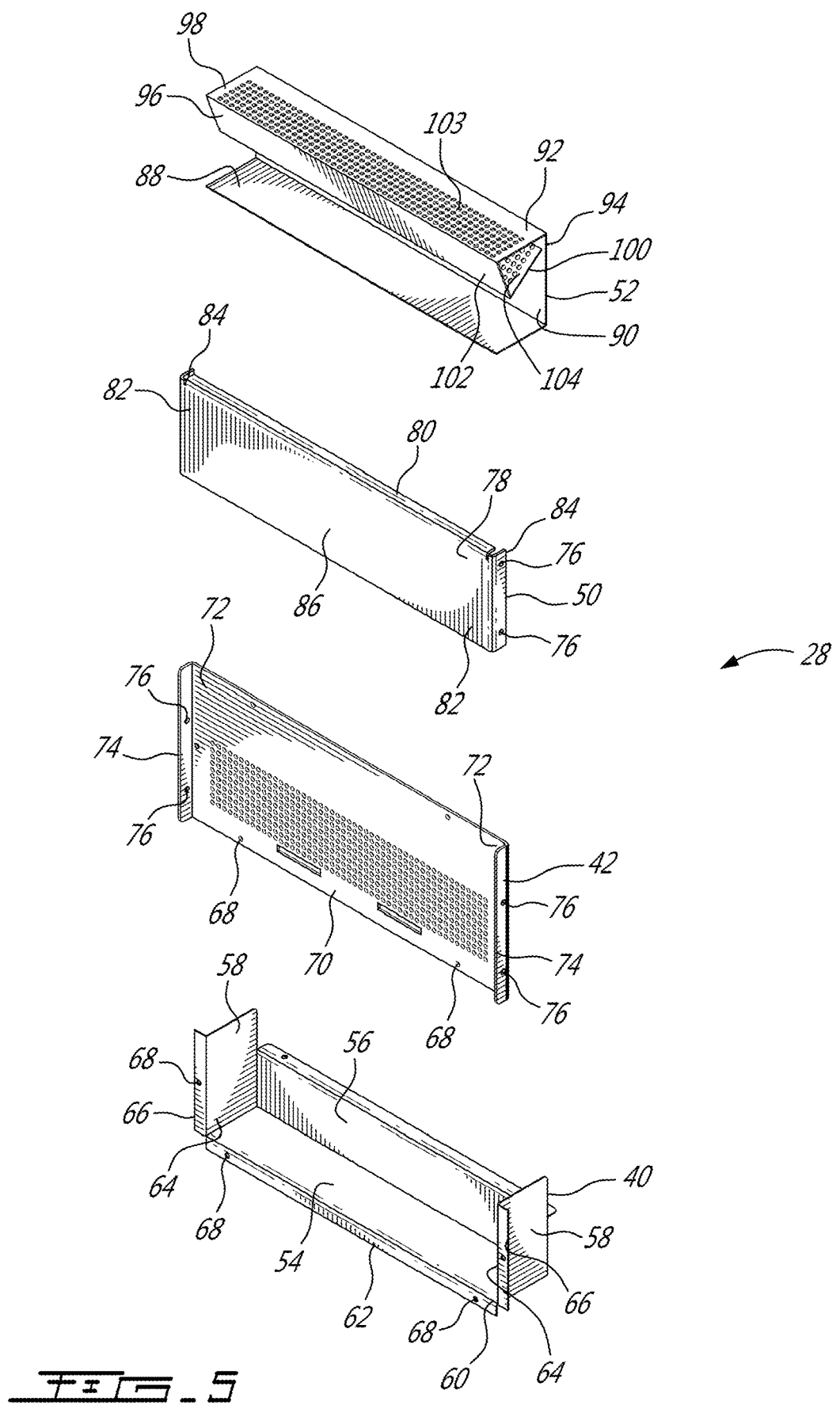
FIG. 5 is an exploded view of the air inlet module of FIG. 4.
Figure 6A:
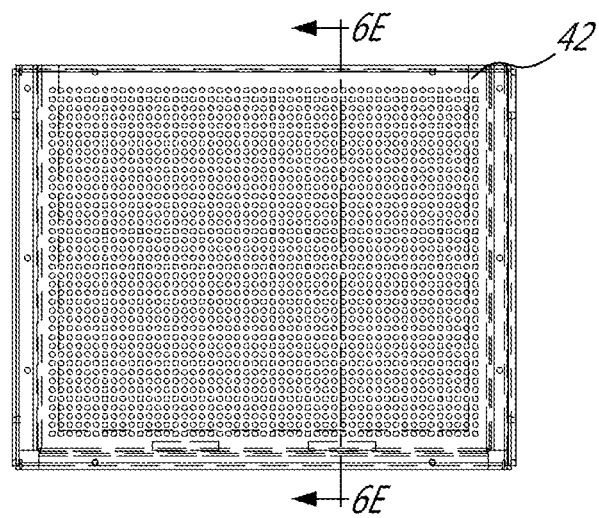
FIGS. 6A to 6E represent different views of another example of an air inlet module having a protector plate and a filter element.
Figure 6B:
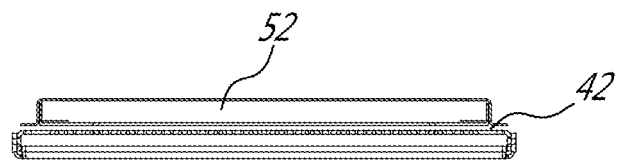
Figure 6C:
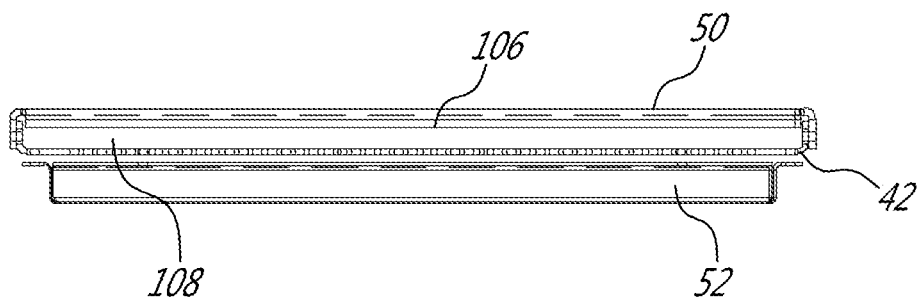
Figure 6D:
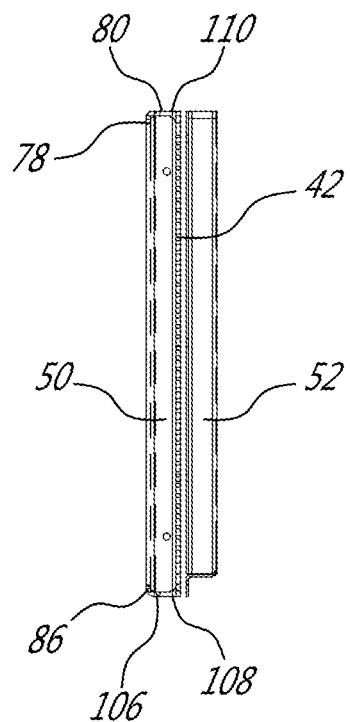
Figure 6E:
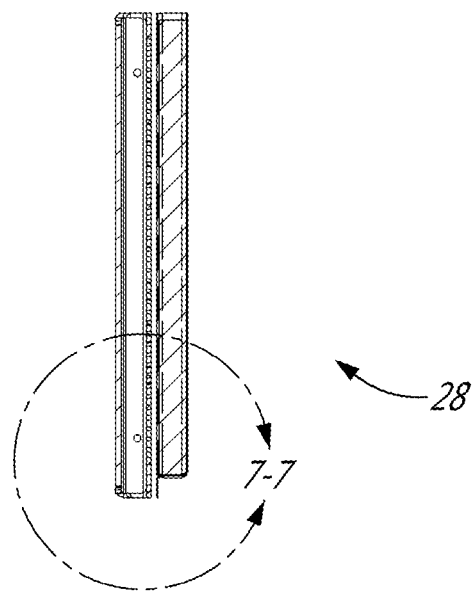
Figure 13A:
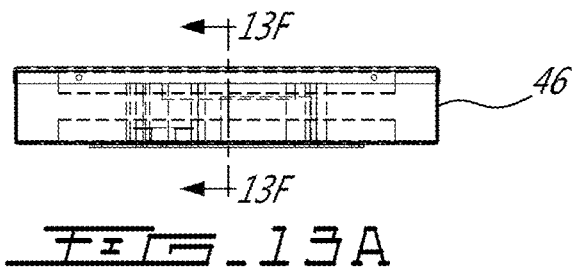
FIGS. 13A to 13F represent different views of the air outlet module of FIG. 11.
Figure 13B:
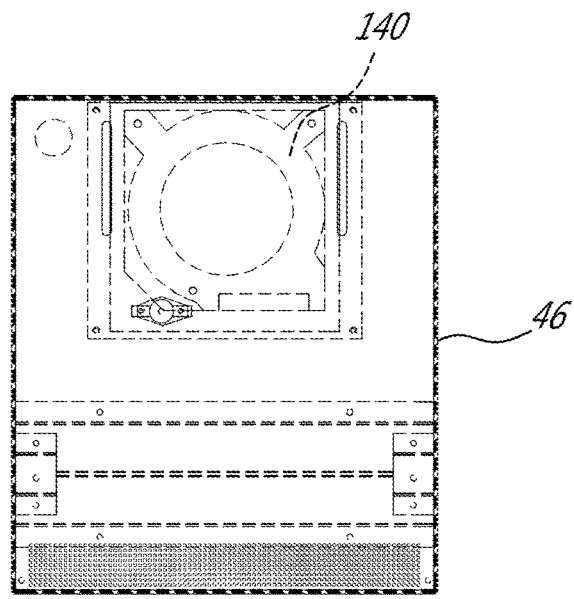
Figure 13C:
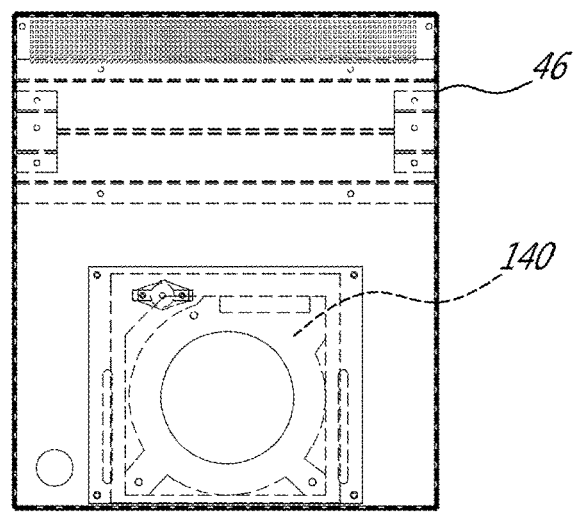
Figure 13D:
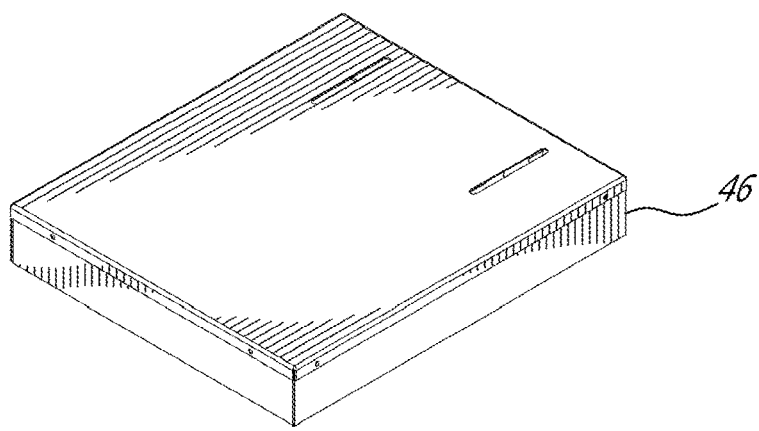
Figure 13E:
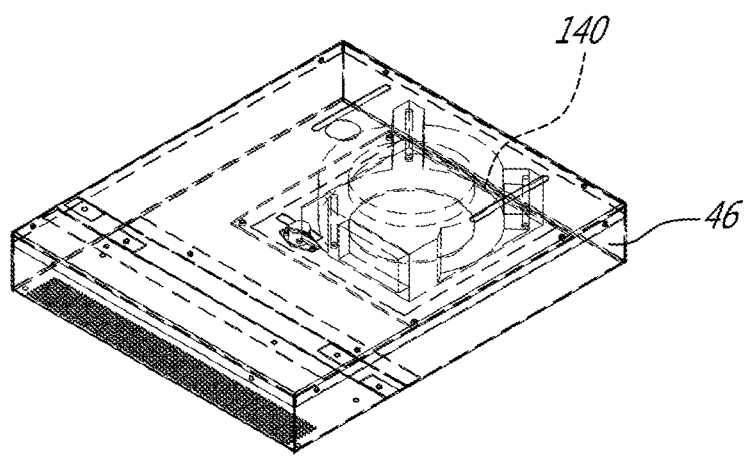
Figure 13F:
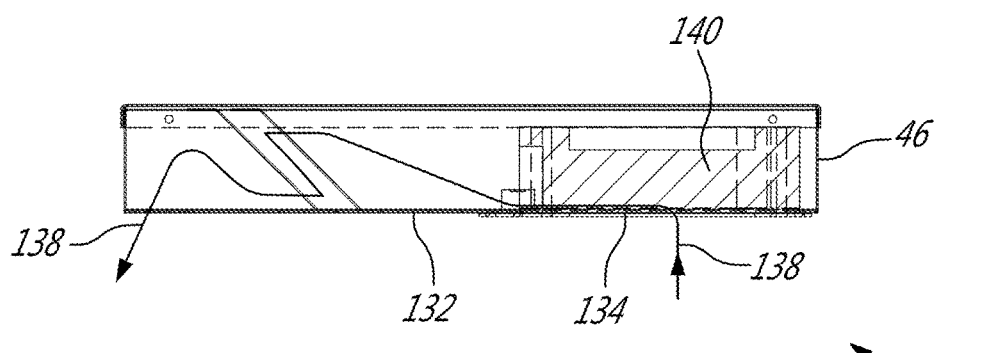

FIG. 5 shows an exploded view of the air inlet module 28 showing the frame 40, the lateral perforated plate 42, the protector plate 50 and the filter element 52.

For instance, the frame 40 has a base 54, a back wall 56 being connected to the base 54 and extending upwardly therefrom, and two walls 58 connected at least to the base 54 and extending upwardly therefrom. The two walls 58 extend upwardly farther than the back wall 56 does in this embodiment. As shown, the base 54 has a forward horizontal edge 60 having a bottom flange 62 extending downwardly and outwardly from the forward horizontal edge 60. The two walls 58 each have a forward vertical edge 64 having a side flange 66 extending laterally and outwardly from a respective one of the two forward vertical edges 64. The flanges 62 and 66 each have one or more bore hole 68 used to mount the frame 40 of the air inlet module 28 to the housing 12 of the electronic cabinet 10 using fasteners (not shown).

In this example, the lateral perforated plate 42 is mounted to the frame 40 of the air inlet module 28. For instance, the lateral perforated plate 42 has a bottom edge 70 having one or more bore hole 68 which is fastenable to the one or more bore hole 68 of the bottom flange 62 of the frame 40 of the air inlet module 28. During use, these bore holes 68 can be fastened to one another using one or more fastener. As it can be seen, the lateral perforated plate 42 has two lateral edges 72 each having a side flange 74 extending outwardly from a respective one of the two lateral edges 72 of the lateral perforated plate 40. Each of these side flanges 74 have one or more bore hole 76.

In this embodiment, the protector plate 50 is mounted to the lateral perforated plate 42. For instance, the protector plate 50 has a top edge 78 having a top flange 80 extending inwardly from the top edge 78 and two lateral edges 82 each having a side flange 84 extending inwardly from a respective one of the two lateral edges 82 of the protector plate 50. It can also have a bottom edge 86 having a bottom flange (not shown in FIG. 5) extending inwardly from the bottom edge 86. Each of the side flanges 84 of the protector plate 50 have one or more bore hole 76 used to mount the protector plate 50 to the lateral perforated plate 42 using fasteners. It is understood that the top flange 80 and the bottom flange of the protector plate 50 are sized and shape to allow air to pass between the protector plate 50 and the lateral perforated plate 42 when mounted to one another.

As shown, the filter element 52 can be received onto the base 54 of the frame 40 of the air inlet module 28 so as to filter the air that is to enter inside the housing of the electronic cabinet. The filter element 52 shown in this embodiment is formed with chicane members so as to prevent harsher or mechanically induced precipitations from damaging the electronic components of the electronic cabinet.

For instance, in this embodiment, the filter element 52 has a base 88 to be received on the base 54 of the frame 40, a back wall 90 connected to the base 88 and extending upwardly from the base 88, a first wall 92 connected to the back wall 90 and extending forwardly and downwardly from a top edge 94 of the back wall 90, a second wall 96 connected the first wall 92 and extending downwardly and inwardly from a forward edge 98 of the first wall 92, a third wall 100 connected to the second wall 96 and extending upwardly and inwardly from an inward edge 102 of the second wall 96. As shown, the first and third walls 92 and 100 are perforated with corresponding rectangular arrays of perforations 103,104 for instance. The back wall 90, first wall 92, second wall 96, and third wall 100 define the chicane members of the filter element 52. This embodiment of the filter element 52 is not limitative as it can have any other suitable configuration.

FIGS. 6A to 6E shows different views of another example of the air inlet module 28. These views include a front elevation view A, a top elevation view B, a bottom elevation view C (not to scale relative to the other views), a side elevation view D and a sectional view E taken along lines A-A. As it can be seen, in this embodiment, the air inlet module 28 can be received in the air inlet module opening 36 of the housing 12 of the electronic cabinet 10 (see FIG. 1). In this embodiment, the air inlet module 28 has a lateral perforated plate 42 directly mountable to the housing of the electronic cabinet, a protector plate 50 outwardly mounted to the lateral perforated plate 42, a filter element 52 inwardly mountable to the housing of the electronic cabinet and over the air inlet module opening 36 (see FIG. 1).

As best seen in the side elevation view D of the air inlet module 28, the protector plate 50 has a bottom edge 86 having a bottom flange 106 extending inwardly from the bottom edge 86 and a top edge 78 having a top flange 80 extending inwardly from the top edge 78. However, the bottom and top flanges 106, 80 do not reach the lateral perforated plate 42 such that they define a respective one of a bottom air inlet 108 and a top air inlet 110. A spacing between an edge of the bottom flange 106 and the lateral perforated plate 42 defining the bottom air inlet 108 and a spacing between an edge of the top flange 80 and the lateral perforated plate 42 defining the top air inlet 110.

FIG. 7 shows an enlarged view of the side elevation view E of the air inlet module 28 of FIGS. 6A to 6E but mounted to the housing 12 of the electronic cabinet. As illustrated, air can follow an air path 112 which passes through the bottom air inlet 108, then through the perforations 41 of the lateral perforated plate 42 and then through the filter element 52 prior to entering inside the housing of the electronic cabinet. As shown, the protector plate 50 can shield the perforations from horizontally-oriented projections of ice or water 114.

FIGS. 8A to 8C show oblique views of the air inlet module 28 of FIGS. 6A to 6E. The top air inlet 110 is best seen in inset E whereas both insets E and F show that the side flanges 84 of the protector plate 50 extend over the side flanges 74 of the lateral perforated plate 42 in order to potentially prevent water, snow, slush and/or particles from entering inside the air inlet module 28.

FIG. 9 shows an oblique view of the air inlet module 28 of FIGS. 6A to 6E taken from the inside of the housing 12 of the electronic cabinet. The air inlet module opening 36 is outwardly covered by the lateral perforated plate 42 and its array of perforations 41 can be seen. In this view, there are provided filter element receiving guides 116 for receiving the filter element 42. In this embodiment, the filter element receiving guides 116 includes two vertical guides (only the guide 116a is shown) inwardly mounted along two side edges 118 of the air inlet module opening 36 of the housing 12 of the electronic cabinet and one horizontal guide 116b inwardly mounted along a bottom edge 120 of the air inlet module opening 36 of the housing 12 of the electronic cabinet. In this configuration, the filter element 52 is slidably engageable to the housing 12 of the electronic cabinet via the filter element receiving guides 116. In another embodiment, the filter element can be fastened to the housing of the electronic cabinet or alternately be snapingly engaged thereto depending on the application.

FIG. 10 shows an oblique view of the air inlet module 28 of FIGS. 6A to 6E taken from the outside of the housing 12 of the electronic cabinet. The lateral perforated plate 42 is mounted to the housing 12 of the electronic cabinet via bore hole(s) and fastener(s) 122. The side flanges 84 of the protector plate 50 are fastened to the side flanges 74 of the lateral perforated plate 42 via bore holes and fasteners 124. The top air inlet 110 is well seen in this view.

FIG. 11 shows an oblique view, taken from the outside and from below, of another example of an electronic cabinet 10 having another example of an air outlet module 30. As shown, the electronic cabinet 10 has a housing 12 having lateral walls 16 including a door 20 hinged to one of the lateral walls 16 and a cover 22 connected to the lateral walls 16. As shown, the air outlet module 30 is provided proximate to the cover 22 of the housing 12 of the electronic cabinet 10 in this example.

As shown, the door 20 is recessed relative to the cover 22 of the housing 12 thus defining a spacing 130 between the door 20 and the cover 22. The recessed portion of the cover 22 has a bottom perforated plate 132 facing downwardly to evacuate the heated air from inside the housing 12 of the electronic cabinet 10 during use.

FIG. 12 is an oblique and sectional view of a top portion of the electronic cabinet 10 shown in FIG. 11. One can see the cover 22 of the housing 12 and a section of the air outlet module 30. In this example, the air outlet module 30 has an enclosure 46 mountable to the interior of the electronic cabinet 10. The enclosure 46 has the bottom perforated plate 132 wherein the perforations are provided at a first end 132a and a bottom air inlet 134 provided in the form of a hole at second end 132b, opposite the first end 132a, of the bottom perforated plate 132. In this embodiment, the enclosure 46 has two chicane members 136 mounted inside the enclosure 46 to create the air path 138. The enclosure 46 can have one or more than two chicane members.

FIGS. 13A to 13F shows different views of the air outlet module 30 of FIG. 11. These views include a front elevation view A, a top elevation view B, a bottom elevation view C, two oblique views D and E and a side elevation view F (not to scale) taken along lines C-C. In this example, the air outlet module 30 has an air blower 140 mounted inside the enclosure 46 and over the bottom air inlet 134 to blow air from the interior of the housing of the electronic cabinet to the outside thereof via the bottom perforated plate 132 along the air path 138.

As can be understood, the examples described above and illustrated are intended to be exemplary only. The filter element of the air inlet module is optional. The scope is indicated by the appended claims.

What is claimed is:

1. An outdoor weather-resistant electronic cabinet for enclosing electronic components, the electronic cabinet comprising:
   a housing having a base and a cover being connected to one another via a plurality of lateral walls, the base, the cover and the lateral walls enclosing an interior of the housing, one of the plurality of lateral walls having a first opening defined through said lateral wall to allow air to enter the housing through the first opening in said lateral wall;

a lateral perforated plate being mounted to said lateral wall of the housing and extending over the first opening of said lateral wall, the lateral perforated plate having a plurality of perforations;

a protector plate being mounted to the housing and extending over the lateral perforated plate to overlay the plurality of perforations of the lateral perforated plate on an exterior side of the electronic cabinet to shield the plurality of perforations from horizontally-oriented projections of ice or water, the protector plate having an edge spaced apart from the lateral perforated plate, an air inlet spacing defined between the edge and the lateral perforated plate;

a spacing between the protector plate and the lateral perforated plate; and a ventilation air path extending from the exterior side of the electronic cabinet, across the air inlet spacing, into the spacing between the protector plate and the lateral perforated plate and across the perforations of the lateral perforated plate;

wherein the lateral perforated plate has two lateral edges each having a side flange extending outwardly from a respective one of the two lateral edges of the lateral perforated plate, the protector plate having two lateral edges each having a side flange extending inwardly from a respective one of the two lateral edges of the protector, the side flanges of the lateral perforated plate being fastened to the side flanges of the protector plate.

2. The outdoor weather-resistant electronic cabinet of claim 1 further comprising a filter element mounted inside the housing and extending over the first opening.

3. The outdoor weather-resistant electronic cabinet of claim 2 further comprising a frame received in the first opening and mounted to the housing, the lateral perforated plate being mounted to the housing via the frame, the protector plate being mounted to the housing via the lateral perforated plate.

4. The outdoor weather-resistant electronic cabinet of claim 3 wherein the filter element has a base which is removably received onto a base of the frame.

5. The outdoor weather-resistant electronic cabinet of claim 4 wherein the filter element includes chicane members.

6. The outdoor weather-resistant electronic cabinet of claim 2 wherein the filter element is slidably engaged within the housing via a plurality of filter element guides.

7. An air inlet module for an outdoor weather-resistant electronic cabinet having a housing and an air inlet module opening defined through a lateral wall of the housing, the air inlet module comprising:

a lateral perforated plate being mountable to the lateral wall of the housing for extending over the air inlet module opening of the lateral wall, the lateral perforated plate being sized and shaped to cover the air inlet module opening, the lateral perforated plate having a plurality of perforations;

a protector plate being mountable to the lateral wall of the housing on an exterior side of the housing, the protector plate connected to the lateral perforated plate, the protector plate being sized and shaped to extend over the lateral perforated plate to overlay the plurality of perforations of the lateral perforated plate to shield the plurality of perforations from horizontally-oriented projections of ice or water, the protector plate having an edge spaced apart from the lateral perforated plate, an air inlet spacing defined between the edge and the lateral perforated plate;

a spacing between the protector plate and the lateral perforated plate; and a ventilation air path extending from the exterior side of the housing, across the air inlet spacing, into the spacing between the protector plate and the lateral perforated plate and across the perforations of the lateral perforated plate;

wherein the protector plate is mountable to the housing on the exterior side of the housing via the lateral perforated plate; and wherein the lateral perforated plate has two lateral edges each having a side flange extending outwardly from a respective one of the two lateral edges of the lateral perforated plate, the edge of the protector plate is a top edge of a bottom edge, the protector plate further having two lateral edges each having a side flange extending inwardly from a respective one of the two lateral edges of the protector, the side flanges of the lateral perforated plate being fastenable to the side flange of the protector plate.

8. The air inlet module of claim 7 further comprising a filter element being mountable inside the housing and extending over the air inlet module opening.

9. The air inlet module of claim 8 further comprising a frame receivable in the air inlet module opening and mountable to the housing, the lateral perforated plate being mountable to the housing via the frame, the protector plate being mountable to the lateral wall of the housing via the lateral perforated plate.

10. The air inlet module of claim 9 wherein the filter element has a base which is removably receivable onto a base of the frame.

11. The air inlet module of claim 10 wherein the filter element includes chicane members.

12. The air inlet module of claim 8 wherein the filter element is slidably engaged within the housing via a plurality of filter element guides being mounted to the housing around the air inlet module opening.

13. An outdoor weather-resistant electronic cabinet for enclosing electronic components, the electronic cabinet comprising:

a housing having a base and a cover being connected to one another via a plurality of lateral walls, the base, the cover and the lateral walls enclosing an interior of the housing, one of the plurality of lateral walls having a first opening defined through said lateral wall to allow air to enter the housing through the first opening in said lateral wall;

a lateral perforated plate being mounted to said lateral wall of the housing and extending over the first opening of said lateral wall, the lateral perforated plate having a plurality of perforations;

a protector plate being mounted to the housing and extending over the lateral perforated plate to overlay the plurality of perforations of the lateral perforated plate on an exterior side of the electronic cabinet to shield the plurality of perforations from horizontally-oriented projections of ice or water, the protector plate having an edge spaced apart from the lateral perforated plate, an air inlet spacing defined between the edge and the lateral perforated plate;

a spacing between the protector plate and the lateral perforated plate;

a ventilation air path extending from the exterior side of the electronic cabinet, across the air inlet spacing, into the spacing between the protector plate and the lateral perforated plate and across the perforations of the lateral perforated plate;

a filter element mounted inside the housing and extending over the first opening; and a frame received in the first opening and mounted to the housing, the lateral perforated plate being mounted to the housing via the frame, the protector plate being mounted to the housing via the lateral perforated plate;

wherein the filter element has a base which is removably received onto a base of the frame;

wherein the filter element includes chicane members; and wherein the chicane members of the filter element includes a back wall connected to the base of the filter element and extending upwardly therefrom, a first wall connected to the back wall and extending forwardly and downwardly from a top edge of the back wall, a second wall connected the first wall and extending downwardly and inwardly from a forward edge of the first wall, a third wall connected to the second wall and extending upwardly and inwardly from an inward edge of the second wall, and at least the first and third walls each having a plurality of perforations.

14. An outdoor weather-resistant electronic cabinet for enclosing electronic components, the electronic cabinet comprising:

a housing having a base and a cover being connected to one another via a plurality of lateral walls, the base, the cover and the lateral walls enclosing an interior of the housing, one of the plurality of lateral walls having a first opening defined through said lateral wall to allow air to enter the housing through the first opening in said lateral wall;

a lateral perforated plate being mounted to said lateral wall of the housing and extending over the first opening of said lateral wall, the lateral perforated plate having a plurality of perforations;

a protector plate being mounted to the housing and extending over the lateral perforated plate to overlay the plurality of perforations of the lateral perforated plate on an exterior side of the electronic cabinet to shield the plurality of perforations from horizontally-oriented projections of ice or water, the protector plate having an edge spaced apart from the lateral perforated plate, an air inlet spacing defined between the edge and the lateral perforated plate;

a spacing between the protector plate and the lateral perforated plate; and a ventilation air path extending from the exterior side of the electronic cabinet, across the air inlet spacing, into the spacing between the protector plate and the lateral perforated plate and across the perforations of the lateral perforated plate;

wherein the edge of the protector plate is a top edge, the top edge having a top flange extending inwardly from the top edge and towards the lateral perforated plate, the air inlet spacing defined between the top flange and the lateral perforated plate.

15. An outdoor weather-resistant electronic cabinet for enclosing electronic components, the electronic cabinet comprising:

a housing having a base and a cover being connected to one another via a plurality of lateral walls, the base, the cover and the lateral walls enclosing an interior of the housing, one of the plurality of lateral walls having a first opening defined through said lateral wall to allow air to enter the housing through the first opening in said lateral wall;

a lateral perforated plate being mounted to said lateral wall of the housing and extending over the first opening of said lateral wall, the lateral perforated plate having a plurality of perforations;

a protector plate being mounted to the housing and extending over the lateral perforated plate to overlay the plurality of perforations of the lateral perforated plate on an exterior side of the electronic cabinet to shield the plurality of perforations from horizontally-oriented projections of ice or water, the protector plate having an edge spaced apart from the lateral perforated plate, an air inlet spacing defined between the edge and the lateral perforated plate;

a spacing between the protector plate and the lateral perforated plate; and a ventilation air path extending from the exterior side of the electronic cabinet, across the air inlet spacing, into the spacing between the protector plate and the lateral perforated plate and across the perforations of the lateral perforated plate;

wherein the edge of the protector plate is a bottom edge, the bottom edge having a bottom flange extending inwardly from the bottom edge and towards the lateral perforated plate, the air inlet spacing defined between the bottom flange and the lateral perforated plate.

16. An air inlet module for an outdoor weather-resistant electronic cabinet having a housing and an air inlet module opening defined through a lateral wall of the housing, the air inlet module comprising:

a lateral perforated plate being mountable to the lateral wall of the housing for extending over the air inlet module opening of the lateral wall, the lateral perforated plate being sized and shaped to cover the air inlet module opening, the lateral perforated plate having a plurality of perforations;

a protector plate being mountable to the lateral wall of the housing on an exterior side of the housing, the protector plate connected to the lateral perforated plate, the protector plate being sized and shaped to extend over the lateral perforated plate to overlay the plurality of perforations of the lateral perforated plate to shield the plurality of perforations from horizontally-oriented projections of ice or water, the protector plate having an edge spaced apart from the lateral perforated plate, an air inlet spacing defined between the edge and the lateral perforated plate;

a spacing between the protector plate and the lateral perforated plate; and a ventilation air path extending from the exterior side of the housing, across the air inlet spacing, into the spacing between the protector plate and the lateral perforated plate and across the perforations of the lateral perforated plate;

wherein the edge of the protector plate is a top edge, the top edge having a top flange extending inwardly from the top edge and towards the lateral perforated plate, the air inlet spacing defined between the top flange and the lateral perforated plate.

17. An air inlet module for an outdoor weather-resistant electronic cabinet having a housing and an air inlet module opening defined through a lateral wall of the housing, the air inlet module comprising:

a lateral perforated plate being mountable to the lateral wall of the housing for extending over the air inlet module opening of the lateral wall, the lateral perforated plate being sized and shaped to cover the air inlet module opening, the lateral perforated plate having a plurality of perforations;

a protector plate being mountable to the lateral wall of the housing on an exterior side of the housing, the protector plate connected to the lateral perforated plate, the protector plate being sized and shaped to extend over the lateral perforated plate to overlay the plurality of perforations of the lateral perforated plate to shield the plurality of perforations from horizontally-oriented projections of ice or water, the protector plate having an edge spaced apart from the lateral perforated plate, an air inlet spacing defined between the edge and the lateral perforated plate;

a spacing between the protector plate and the lateral perforated plate; and a ventilation air path extending from the exterior side of the housing, across the air inlet spacing, into the spacing between the protector plate and the lateral perforated plate and across the perforations of the lateral perforated plate;

wherein the edge of the protector plate is a bottom edge, the bottom edge having a bottom flange extending inwardly from the bottom edge and towards the lateral perforated plate, the air inlet spacing defined between the bottom flange and the lateral perforated plate.

\* \* \* \* \*